United States Patent [19]
Jensen

[11] Patent Number: 4,942,282
[45] Date of Patent: Jul. 17, 1990

[54] SPLIT HEATER BAR

[75] Inventor: Wayne P. Jensen, San Marcos, Calif.

[73] Assignee: Hughes Aircraft Company, Los Angeles, Calif.

[21] Appl. No.: 367,164

[22] Filed: Jun. 16, 1989

[51] Int. Cl.$^5$ .............................................. B23K 3/04
[52] U.S. Cl. .............................. 219/85.16; 219/85.18; 219/233
[58] Field of Search .................. 219/85.16, 85.18, 129, 219/78, 228, 243, 233; 156/5.4, 583.2; 228/179, 180, 51, 50

[56] References Cited
FOREIGN PATENT DOCUMENTS
3722765 7/1987 Fed. Rep. of Germany ...... 219/233

Primary Examiner—Clifford C. Shaw
Attorney, Agent, or Firm—Joseph E. Szabo; Wanda K. Denson-Low

[57] ABSTRACT

The transverse member (29) of a reflow soldering heater bar (23) is slotted at intervals to reduce thermal expansion. The slots (63), which typically extend orthogonally through the transverse member (29) and the connecting legs (61) of the heater bar (23), may extend diagonally therethrough to prevent missed welds.

12 Claims, 5 Drawing Sheets

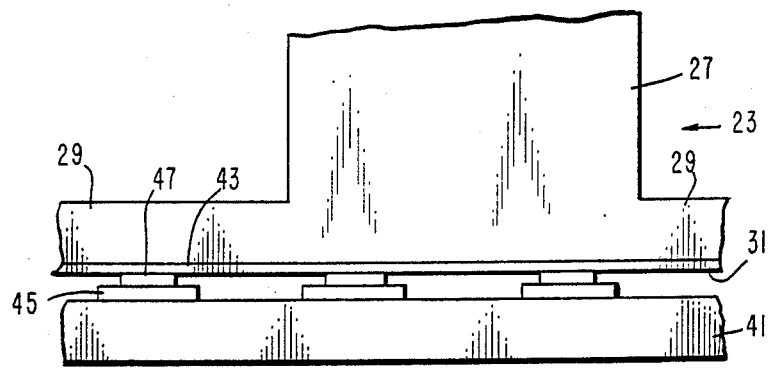
Fig. 4.
(PRIOR ART)
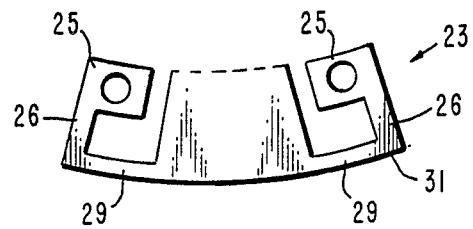
Fig. 5.
(PRIOR ART)
Fig. 6.
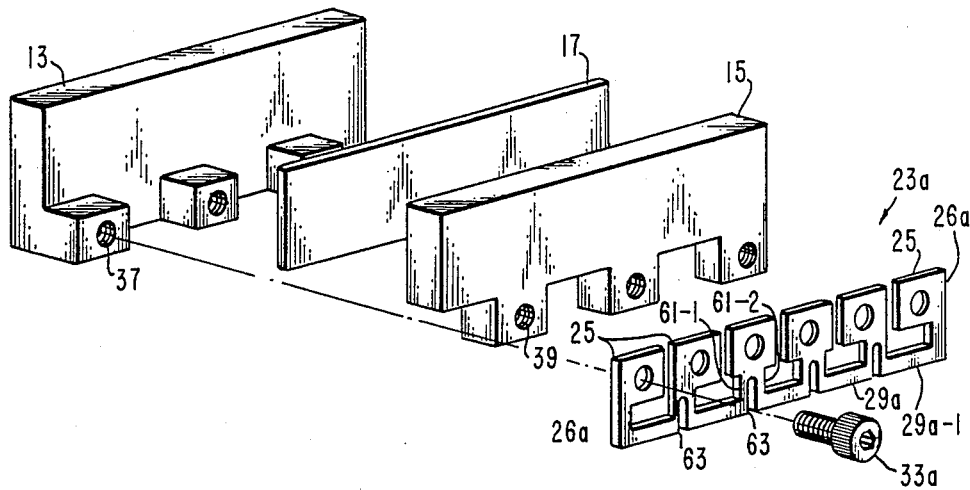

SPLIT HEATER BAR

BACKGROUND OF THE INVENTION

1. Field of the Invention

This invention relates in general to heater bars for reflow soldering and more particularly to such heater bars energized by current pulses.

2. Description of Related Art

Welding, as it will be used herein, includes various processes for bonding metals, including fusion, brazing and, most particularly, reflow soldering. Reflow soldering refers to that method of bonding in which metal parts are precoated with solder and are heated during bonding until the solder melts or "reflows." Once this has occurred, heat is removed, the solder solidifies and the parts have been bonded. Reflow soldering may be either continuous or pulse heated. In the continuous mode a holding member is interposed between the metals that are to be bonded and the heating element. The intermediate holding member secures the parts after they have been heated and after the heating element has been withdrawn, so that the reflowed solder may cool without the parts being disturbed by withdrawal of the heating element. With pulsed heat reflow soldering, the heating element is pressed directly against the parts to be bonded, serving both as a source of heat and as the means for holding the parts together until the reflowed solder has solidified. In a typical application the heating element is in the form of an electrically and thermally conductive heater bar mounted on a welding head having a series of spaced apart electrical terminals. The heater bar, whose resistance is relatively high, is resistance heated by the current which flows through it. It includes a bar-shaped transverse member having a front working surface which engages the parts to be soldered and a rear surface. Current is supplied to the transverse member through a plurality of spaced apart members, each including at one end a connecting leg extending from the rear surface of the transverse member at an angle and terminating at its opposite end in a contact pad. The heater bar is mounted on the welding head by engagement of respective ones of the mounting pads with corresponding ones of the welding heads' electrical terminals.

Two problems have been experienced with the above type of heater bar: Expansion, in general, and deformation as a result of uneven expansion.

Expansion of the heater bar is a particular problem with pulse heating where the heater bar contacts the workpiece directly. Expansion of the heater bar during the bonding process while it is being pressed against the workpiece and while heat flows from the heater bar into the workpiece can easily cause bonding pads on the workpiece against which the heater bar is being pressed to be slid from their proper positions, causing permanent damage.

Uneven deformation, on the other hand, damages the heater bar itself. It is caused by the fact that the mounting pads are solidly anchored in the welding head, whereas the transverse member of the heater bar is free to expand and contract. After a number of heating cycles this uneven expansion causes permanent deformation of the heater bar, manifested in a permanent bend in that transverse member. This not only destroys the flatness of the heater bar's working surface, it also makes the heater bar difficult to remount on the welding head once it has been removed, because the effect of the bend in the transverse member is to cause the spaced-apart members, which include the connecting legs, to become tilted relative to their original orientation.

Accordingly, it is the principal object of the present invention to so modify heater bars currently in use as to significantly reduce their tendency to expand when heated. In accordance with the invention, the above and other objects of the invention are achieved by a heater bar whose transverse member is slotted along planes which intersect at least some of its connecting legs. By introducing slots in the transverse member, the cumulative effect of the expansion of individual portions which lie between adjacent slots is largely eliminated, so that the total expansion of the transverse member is greatly reduced. Preferably, each slot extends entirely through the transverse member and into one of the connecting legs. The connecting legs into which the slots extend may extend all the way to the mounting pads, whose cross sectional area will usually be substantially greater than that of the connecting legs which they terminate. In that event it is preferred that the slots extend not only into the connecting legs but substantially all the way to the mounting pads, so that the connecting legs are split along their entire length.

In one preferred embodiment, where the heater bar is machined from flat stock so that it is defined by a pair of surfaces lying in spaced-apart parallel planes, it is preferred that the slots extend transversely, i.e. lie in planes which intersect the first and second planes substantially orthogonally. However, in accordance with another preferred embodiment of the invention whose purpose will become clearer as this description proceeds, the slots are slanted, i.e. so as to lie in planes which intersect the first and second planes defining the heater bar at an acute angle, preferably substantially diagonally through the connecting legs.

In some applications it is necessary to extend the distance between the transverse member of the heater bar and its series of mounting pads in order to reach recessed parts that are to be bonded. In such applications the spaced-apart members, which include at one end the contact pads and at the opposite end the connecting legs, include, in addition, an intermediate portion whose cross-sectional area is greater than that of the connecting leg in order to provide an adequate path for the current that must be conducted from the mounting pad to the connecting leg. Such an intermediate portion may be simply a linear extension of the mounting pad, so that the mounting pad is attached at its terminal end to the welding head and extends away from and beyond the welding head toward the transverse member, terminating in a connecting leg whose cross-sectional area is substantially smaller than that of the mounting pad. With this type of heater bar it is preferred that the slot extend through the transverse member into the connecting leg up to the transition between the connecting leg and the extended mounting pad. By so terminating the slots, the connecting legs, which because of their smaller cross-sectional area tend to get much hotter than the intermediate portion which connects them with the mounting pads, are free to spread as the transverse member expands.

The invention together with additional features and advantages thereof may best be understood by reference to the following description taken in connection with the accompanying illustrative drawings.

BRIEF DESCRIPTION OF THE DRAWINGS

FIG. 4 is an expanded view of a portion of FIG. 2.

FIG. 5 shows the heater bar of the known type deformed a permanent "smile" due to repeated heating/cooling cycles.

FIG. 6 is an exploded perspective view of the split heater bar of the present invention mounted in place of the heater bar in FIG. 1.

DESCRIPTION OF THE PREFERRED EMBODIMENT

Figure 1:
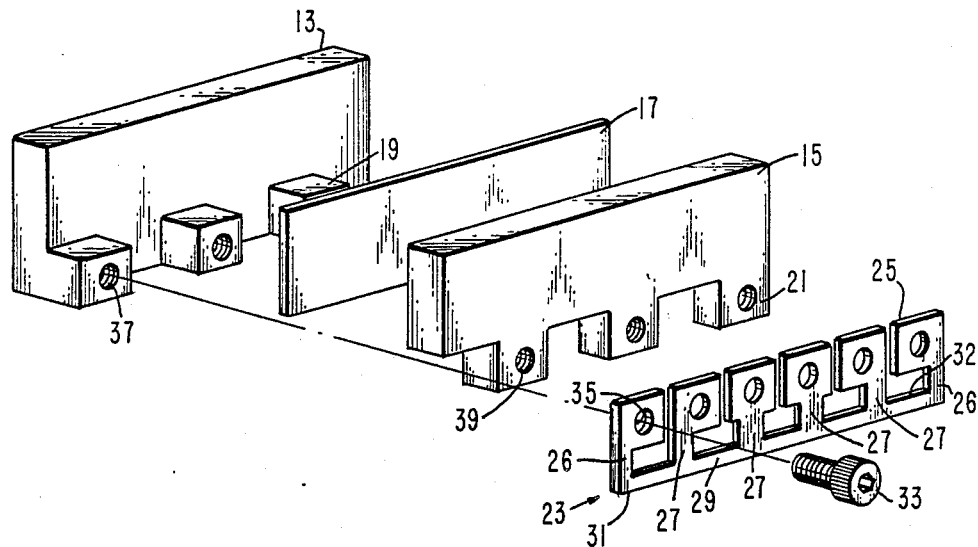
FIG. 1 expanded perspective view of a known type of heat bar mounted on a pair of mounting blocks which form of a welding head.

Shown in FIG. 1 is a heater assembly that is being currently used. It normally forms part of a welding head, not shown, which serves to provide a current path from a power supply to the weld area and also any necessary force to the members that are being joined. Forming part of such a weld head are a pair of mounting blocks 13,15 illustrated schematically in FIG. 1, although their actual configuration may be more complex. The mounting blocks 13,15 serve as the main conduits in a current path whose source will typically be a power supply of a type which is available from the Industrial Products Division of Hughes Aircraft Company and is listed in its Catalog 801 entitled "Resistance Welding and Reflow Soldering Equipment" as Hughes Model HTT-650. Electrical terminals 19 extend transversely from first mounting block 13, and electrical terminals 21 similarly extend from the second mounting block 15. Sandwiched between and separating the mounting blocks 13,15 is an insulating layer 17, with the terminals 19 and 21 being spaced and dimensioned so that when the mounting blocks are assembled with the insulating layer tightly between them, their respective terminals 19,21 alternate.

The heater bar 23 of the prior art, whose drawbacks the present invention is designed to overcome, comprises a plurality of mounting pads 25 spaced apart in registry with the respective terminals 19,21. Extending opposite the mounting pads 25 and generally parallel thereto is a bar-shaped transverse portion 29 having a heating surface 31 and a rear surface 32. Extending from the rear surface 32 toward the mounting pads 25 are a plurality of legs including outer legs 26 and inner legs 27, each leg terminating in a respective one of the mounting pads 25.

Each mounting pad 25 is provided with a mounting hole 35 positioned in registry with one of a plurality of threaded mounting holes 37,39 in the mounting block terminals 19,21, respectively. The heater bar 23 is secured to the assembled mounting blocks 13,15 by a set of evenly tightened mounting screws 33.

The outer legs 26 carry about half the current carried by the inner legs 27, which is why the inner legs 27 are approximately twice as wide as the outer legs 26. The segments of the transverse portion 29 intermediate each pair of legs 26,27 carry approximately the same amount of current as do the outer legs, which is why their cross-sections are comparable in size.

Figure 2:
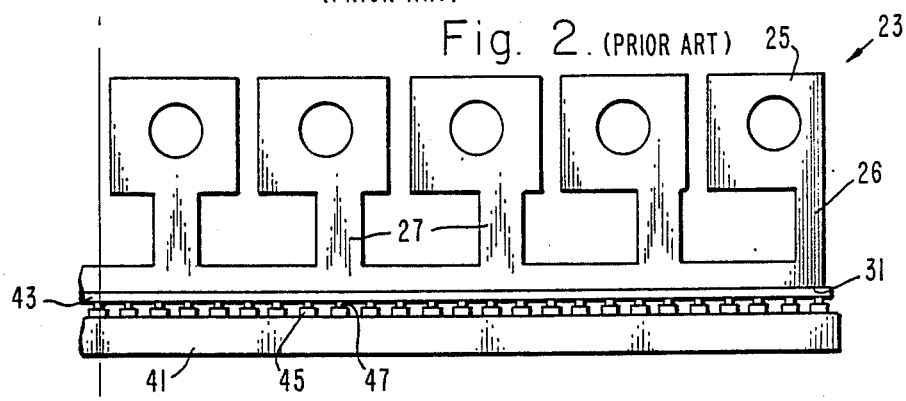
FIG. 2 a cross-section through one half of the heater bar 1 in contact with a flexible cable while the bar is cold.
Figure 3:
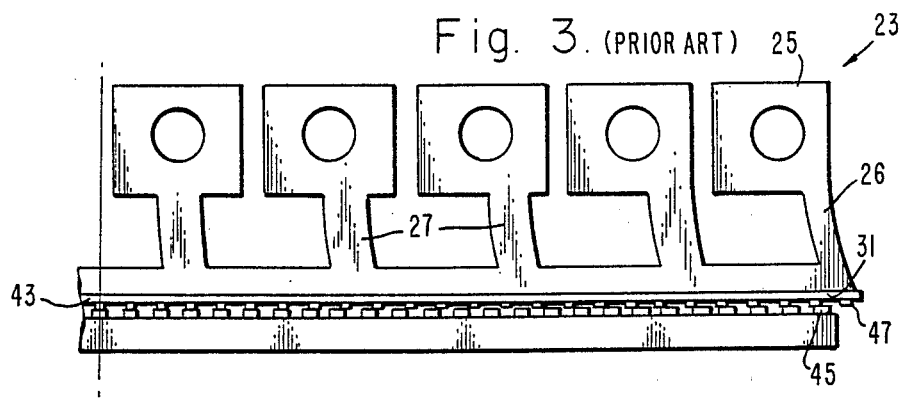
FIG. 3 is a cross-section through the assembly of FIG. 2 when the heater bar is hot and has expanded.

FIGS. 2, 3 and 4 illustrate the problem of expansion with the heater bar 25 of the prior art. They illustrate an application in which the heater bar is pressed against a "flex" circuit or similar component 43 whose copper traces 47 lie on top of, and are to be bonded to, corresponding connecting pads 45 of a printed wiring board 41. In this application current is pulsed, typically at intervals on the order of four seconds on and four seconds off, through the heater bar 23, causing it to alternate in temperature between about 80° C. and 500° C. The shape of the heater bar at the lower and higher temperatures is shown in FIGS. 2 and 3, respectively, with details of the heater bar in its cooler state being shown in FIG. 2. As is readily apparent from FIG. 3, the heater bar 23 when heated tends to adhere to the upper surface of the flex circuit 43, causing the flex circuit to expand as the heater bar 23 expands along its heating surface 31. The result may be missed joints and damaged circuits.

Illustrated in FIG. 5 is a second problem—the uneven expansion of the heater bar due to its mounting pads 25 being anchored on the mounting blocks 13,15 and being also kept at a relatively cool temperature compared to that of its transverse bar portion 29.

Due to the unrestricted expansion of the transverse member 29 when heated, legs 26 and 27 are bent outwardly, toward opposite ends of the heater bar 23. And, due to work hardening, the deformation of the legs becomes set, causing a permanent "smile" to be frozen into the part after multiple heating cycles. This removes the flatness of the heating surface 31, interfering with the proper use of the part.

Figure 7:
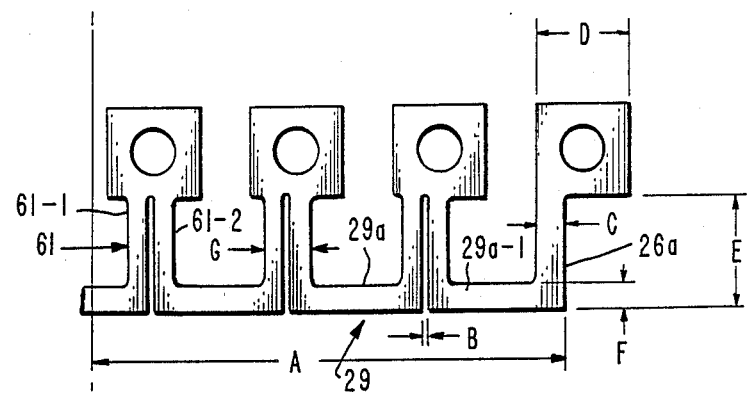
FIG. 7 is a plan view of one half of the split heater bar shown in FIG. 6.

An exemplary embodiment of the present invention is illustrated in FIGS. 6 and 7. It is similar to the prior art heater bar 23 and elements which find a counterpart in the heater bar 23a are identified with corresponding reference numerals but with the suffix "a" added. In accordance with the invention, in place of each of the inner legs 27 there is provided a slotted inner leg 61 comprising two portions 61-1 and 61-2 separated by a slot 63. The slots 63 provide room for the individual segments of the transverse portion 29a of the heater bar to expand without the expansions of the individual segments cumulating or adding their individual expansions as would be the case with the heater bar 23 of the prior art. As a result, the extent of the thermally induced displacement of the outer —extremes of the transverse portion 29a is greatly reduced.

In fabricating a split heater bar in accordance with the invention, it is preferably formed from flat stock by electrical discharge machining. Some of the design considerations which should enter into dimensioning the slotted heater bar 23a include the length and width of the individual segments of the transverse portion 29a and of the outer legs 26a and of the inner legs 61. Controlling the length of the outer legs 26a is the amount of current which it is desired to conduct through the outermost segments of the transverse portions 29a since the longer the outer legs 26a, the higher their resistance and the lower amount of current they will conduct. Conversely, the cross-sectional area of the outer legs 26a will need to be comparable to that of the outermost portions of the transverse section 29a, keeping in mind, however, that a certain amount of heat will be drawn away from those transverse sections which, therefore, will tend to run somewhat cooler than the outer legs 26a. For this reason those legs should have a cross section slightly smaller than that of the outermost transverse sections 29a–l. And, since each of the inner legs 61 will be called upon to carry substantially twice the current of the outer legs 26a or, conversely, since each segment 61-1 and 61-2 will be called upon to carry the same amount of current as that which flows through each of the transverse sections of 29-a, each such segment 61-1 and 61-2 should have substantially the same cross sectional area as that of one of the segments 29a of the transverse section 29.

While it is contemplated that ordinarily the slots 63 will extend entirely through the transverse section 29a of the split heater bar 23a, the extent to which the slots extend beyond and into the inner legs 61 may vary with circumstances. Optimally, they should extend to a point where the cross-section of the member of which the legs 61 form a part becomes significantly larger, forming a pivot point for the flexing of the split portion of the legs. In the embodiment illustrated in FIGS. 6 and 7, this means that the slots extend all the way to the mounting pads 25.

Figure 9:
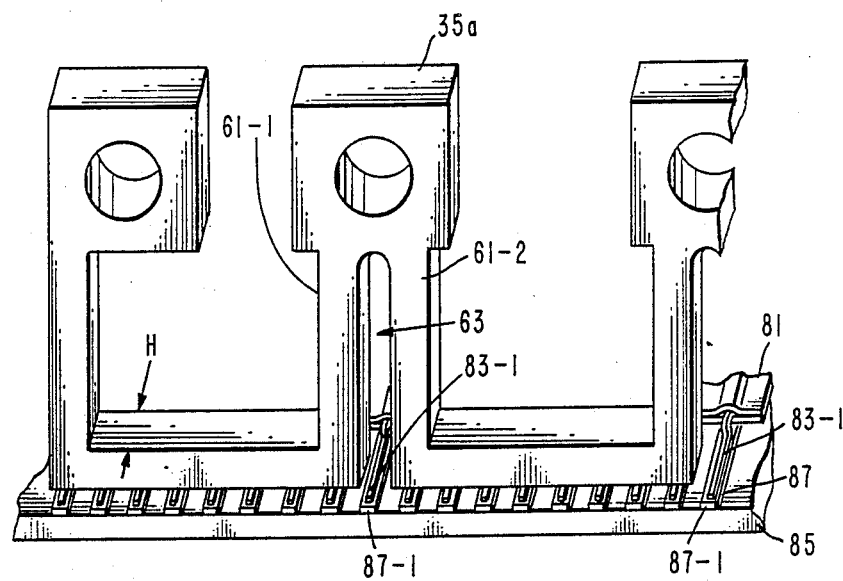
FIG. 9 is a partially broken away perspective view of the split heater bar illustrated in FIGS. 6 and 7 contacting a flexible cable and illustrating that connectors on the cable may fall within the split in one or more legs of the split heater bar.

A particular heating element, configured as shown in FIGS. 7 and 9, was fabricated with the following dimensions (in inches) keyed to the corresponding letters in FIGS. 7 and 9:

| | |
|---|---|
| A = 1.260 | E = 0.300 |
| B = 0.006–.008 | F = .0650 |
| C = 0.0618 | G = 0.1316 |
| D = 0.250 | H = 0.080 |

Figure 8:
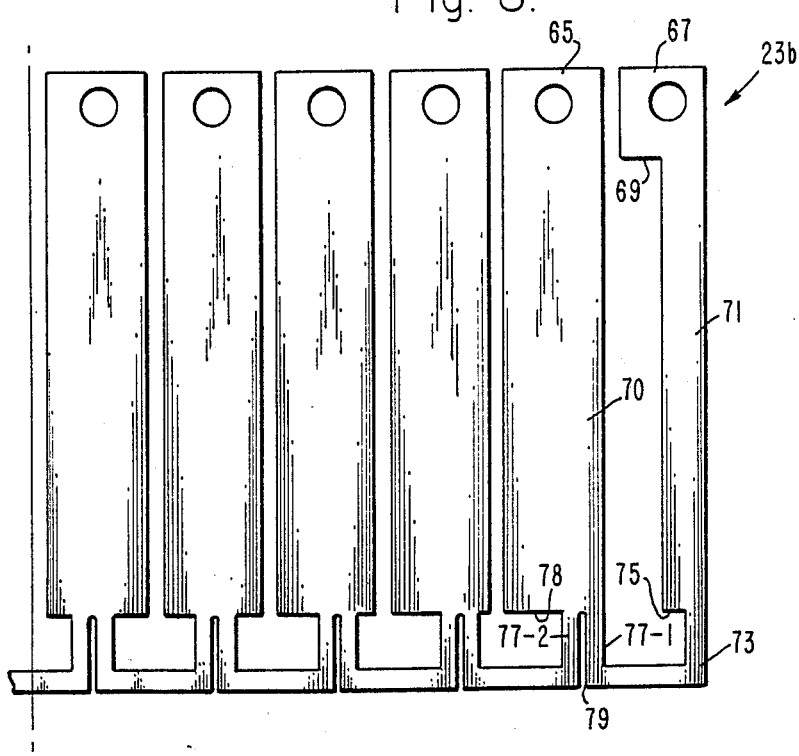
FIG. 8 is a plan view of one half of a modified heater bar made in accordance with the invention in which members terminating in connecting legs at one end and mounting pads at the opposite end include an intermediate portion between the connecting legs and mounting pads in order to provide increased reach into recessed areas.

An alternative embodiment of the slotted heater bar is illustrated in FIG. 8. Shown therein is a heater bar in which each member which comprises a mounting pad at one end and a leg at the opposite end has an extended intermediate portion joining the two ends. Specifically, each of the inner mounting pads 65 whose function is the same as that of the mounting pads 25 in FIG. 6 is extended integrally beyond the vicinity of the mounting holes at their upper ends through intermediate portions 70. The outer mounting pads 67 are similar, except that their intermediate portions 71 are about half the size in cross-section as are the intermediate portions 70 of the inner mounting pads 65. Thus each of the outer mounting pads 67 transitions through a shoulder 69 into a constricted portion 71 which further transitions at a second shoulder 75 into an outer leg 73 whose function corresponds to that of the outer legs 26a of FIGS. 6 and 7. The inner mounting pads 65 extend undiminished in cross section until shoulder 78 where they transition into the portions 77-1 and 77-2 of the split leg 77. With comparable dimensional and heating requirements, the embodiments illustrated in FIGS. 7 and 8 may be comparably dimensioned in the vicinity of the shoulder 78. That is to say, the dimensions of the transverse portions and of the split legs will be the same. And, typically, the slots of the FIG. 8 embodiment will extend to the shoulders 78 which, as in the case of the FIG. 7 embodiment, is the point where the cross-section of the member terminated in the legs 77 increases substantially.

Figure 10:
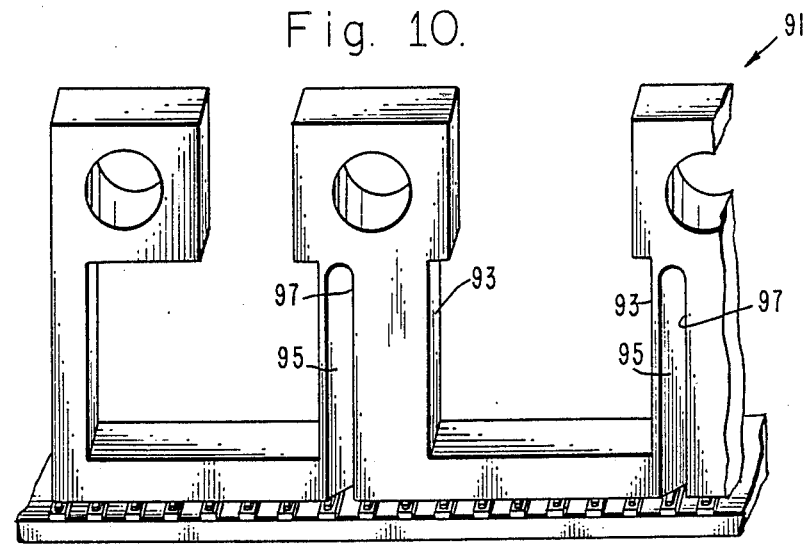
FIG. 10 is a perspective view, partially broken away, of a modified version of the split heater bar in which the splits extend through the heater bar at a slant in order to insure that no connector lead is totally missed by falling entirely within one of the splits.
Figure 11:
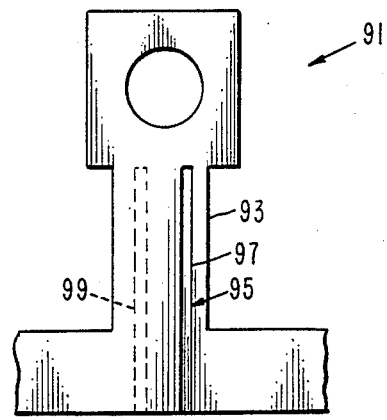
FIG. 11 is a plan view of one of the members of the FIG. 10 embodiment.
Figure 12:
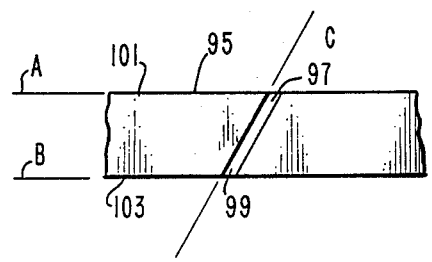
FIG. 12 is an end view of the member illustrating FIG. 11 showing a preferred diagonal orientation of the slit therein.

The need in certain circumstances for a further improvement and an additional embodiment is illustrated in FIG. 9, and that additional embodiment is shown in FIGS. 10, 11 and 12. FIG. 9 shows a typical application of the slotted heater bar 23a wherein the stripped leads 83 of a flex cable 81 are to be bonded to traces 87 carried by a printed wire board 85. Even though the slots 63 of the heater bar 23a may be as small as 0.008 in., it is possible for the leads 83 and traces 87 to be so fine as to fall entirely within one of the slots. One such trace 87-1 is illustrated in FIG. 9, along with a corresponding lead 83-1 which should be bonded to it. In fact, thermal contact is absent and the bond will not occur because of the slot 63. This problem is overcome by the embodiment of FIGS. 10–12 in which slots 95 extend at a slant, substantially diagonally through inner legs 93 of a heater bar 91. Even though the slots are substantially equal in width to the transverse slot 63 illustrated in FIG. 9, none of the transversely extending traces 87 or leads 83 fall entirely within any single slot 95.

As shown in FIG. 12, the heater bar 91 has two principal surfaces 101,103 which lie in a pair of parallel planes A and B. Each slot 95 lies in a plane C which intersects the planes A and B at an acute angle. While the substantially diagonally extending slot illustrated in FIGS. 10–12 is preferred, the slot may lie in planes other than those that extend substantially diagonally through the inner legs 93 and still accomplish the objects of this embodiment although, perhaps, less effectively.

What is claimed is:

1. For use with a welding head having a series of spaced apart electrical terminals, an electrically and thermally conductive heater bar comprising in combination:
    a. a bar shaped transverse member having a front heating surface and a rear surface; and
    b. a plurality of spaced apart members, each member including at one end a connecting leg extending from the rear surface of said transverse member and terminating at its opposite end in a mounting pad adapted to engage a respective one of said electrical terminals; said heater bar being characterized in that said transverse member is slotted along planes which intersect at least some of said connecting legs.

2. The heater bar of claim 1 characterized in that each said slot extends entirely through said transverse member and into one of said connecting legs.

3. The heater bar of claim 2 characterized further in that the connecting legs into which said slots extend terminate in contact pads whose cross-sectional area is greater than that of the connecting legs which they terminate and in that said slots extend substantially to said mounting pads.

4. The heater bar of claim 2 characterized further in that said slots extend transversely through said heater bar.

5. The heater bar of claim 2 characterized further in that said heater bar has two principal surfaces lying in parallel planes and in that said slots lie in planes which intersect said parallel planes at an acute angle.

6. The heater bar of claim 5 characterized further in that slots extend through said connecting legs substantially diagonally.

7. The heater bar of claim 2 characterized further in that said legs extend linearly in a plane and said slots lie in planes that intersect said plane at substantially right angles.

8. The heater bar of claim 2 characterized further in that said legs extend in a row in a plane and in that said slots lie in planes that intersect said plane at an acute angle.

9. The heater bar of claim 8 characterized further in that said acute angle is substantially 45°.

10. The heater bar of claim 9 characterized further in that the width of said slots is a fraction of the width of said legs.

11. The heater bar of claim characterized further in that at least one of said members includes an intermediate portion between its mounting pad and its connecting leg, said intermediate portion having a cross-sectional area which is greater than that of said connecting leg and in that said slot extends substantially to said intermediate portion.

12. For use with a welding head having a series of spaced apart electrical terminals, an electrically and thermally conductive heater bar comprising in combination:
   (a) a bar shaped transverse member having a front heating surface and a rear surface; and
   (b) a plurality of spaced apart members, each member including at one end a connecting leg extending from the rear surface of said transverse member and terminating at its opposite end in a mounting pad adapted to engage a respective one of said electrical terminals; said heater bar being characterized in that said transverse member is slotted along planes which intersect said connecting legs, each slot extends entirely through said transverse member and into one of said connecting legs.

* * * * *